(12) United States Patent
Yan et al.

(10) Patent No.: US 11,211,502 B2
(45) Date of Patent: Dec. 28, 2021

(54) TRANSISTOR AND MANUFACTURING METHOD THEREOF, TRANSISTOR DEVICE, DISPLAY SUBSTRATE AND APPARATUS

(71) Applicants: Ordos Yuansheng Optoelectronics Co., Ltd., Inner Mongolia (CN); BOE Technology Group Co., Ltd., Beijing (CN)

(72) Inventors: Lei Yan, Beijing (CN); Jianyun Xie, Beijing (CN); Yezhou Fang, Beijing (CN); Jun Fan, Beijing (CN); Feng Li, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/915,219

(22) Filed: Jun. 29, 2020

(65) Prior Publication Data

US 2021/0020787 A1    Jan. 21, 2021

(30) Foreign Application Priority Data

Jul. 19, 2019   (CN) .......................... 201910655573.0

(51) Int. Cl.
| | | |
|---|---|---|
| *H01L 29/786* | (2006.01) | |
| *H01L 27/12* | (2006.01) | |
| *H01L 29/66* | (2006.01) | |

(52) U.S. Cl.
CPC .... *H01L 29/78696* (2013.01); *H01L 27/1222* (2013.01); *H01L 29/66742* (2013.01)

(58) Field of Classification Search
CPC ......... H01L 29/78696; H01L 29/66742; H01L 1127/1222
USPC .......................................................... 257/72
See application file for complete search history.

(56) References Cited

U.S. PATENT DOCUMENTS

| | | | | |
|---|---|---|---|---|
| 5,341,327 A | * | 8/1994 | Kuriyama | ........... H01L 27/1108 365/154 |
| 2007/0128777 A1 | * | 6/2007 | Yin | ................... H01L 29/78696 438/151 |
| 2008/0166860 A1 | * | 7/2008 | Yamazaki | ......... H01L 29/78645 438/479 |
| 2012/0146713 A1 | * | 6/2012 | Kim | ................... H01L 29/7869 327/530 |

* cited by examiner

*Primary Examiner* — Tong-Ho Kim
(74) *Attorney, Agent, or Firm* — Fay Sharpe LLP

(57) ABSTRACT

Provided is a transistor, the transistor being located on a base and having an active layer, and the active layer of the transistor comprising a plurality of semiconductor patterns which are stacked, wherein the plurality of semiconductor patterns are electrically connected; and orthographic projections of any two of the semiconductor patterns on the base are different in shape. A method of manufacturing a transistor, a transistor device, and a display substrate and apparatus are also provided.

18 Claims, 7 Drawing Sheets

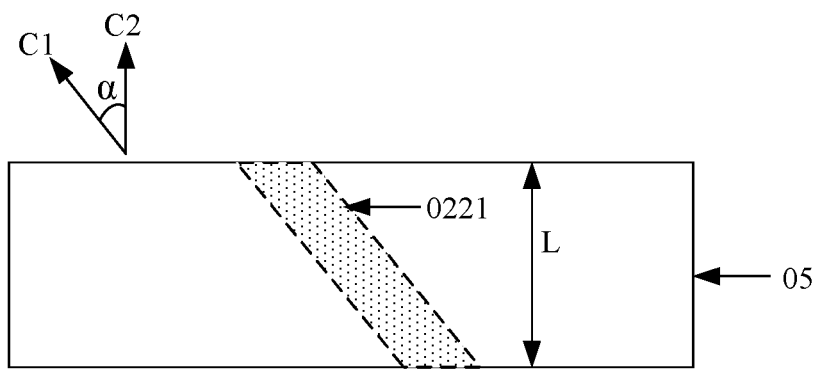
FIG. 9
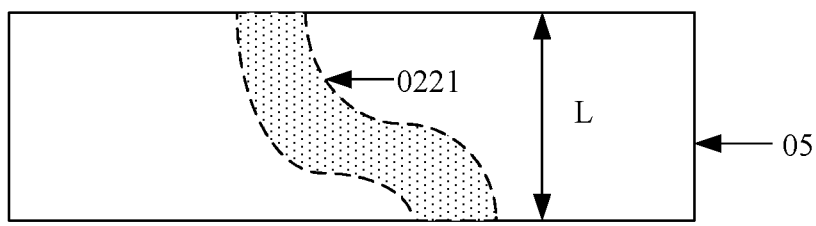
FIG. 10
| Forming a plurality of semiconductor patterns which are stacked on a base to obtain an active layer in the transistor, the plurality of semiconductor patterns being electrically connected, and orthographic projections of any two of the semiconductor patterns onto the base being different in shape | 1101 |
FIG. 11

TRANSISTOR AND MANUFACTURING METHOD THEREOF, TRANSISTOR DEVICE, DISPLAY SUBSTRATE AND APPARATUS

CROSS REFERENCE OF RELATED APPLICATION

The present application claims priority to Chinese Patent Application No. 201910655573.0, filed on Jul. 19, 2019 and entitled "TRANSISTOR AND MANUFACTURING METHOD THEREOF, TRANSISTOR DEVICE, DISPLAY SUBSTRATE AND APPARATUS", the entire contents of which are incorporated herein by reference.

TECHNICAL FIELD

The present disclosure relates to a transistor and a manufacturing method thereof, a transistor device, a display substrate and a display apparatus.

BACKGROUND

Transistors are widely used in display apparatuses and bring greatly improvement to the performance of the apparatuses.

A transistor generally includes a gate, an active layer, a source and a drain. The gate is configured to control the switch-on and switch-off of the active layer, and the source and the drain can be electrically connected through the active layer when the active layer is turned on.

SUMMARY

The present disclosure provides a transistor and a manufacturing method thereof, a transistor device, a display substrate and a display apparatus, and the technical solutions are as follows:

In a first aspect, the present disclosure provides a transistor, the transistor being located on a base and having an active layer, and the active layer of the transistor including a plurality of semiconductor patterns which are stacked, wherein the plurality of semiconductor patterns are electrically connected; and orthographic projections of any two of the semiconductor patterns on the base are different in shape.

Optionally, the plurality of semiconductor patterns are respectively located in different layers.

Optionally, the plurality of semiconductor patterns include at least two semiconductor patterns located in a same layer.

Optionally, the plurality of semiconductor patterns include: a first semiconductor pattern and a second semiconductor pattern that are stacked, and the transistor further includes: a target insulating layer; and the target insulating layer is located between the first semiconductor pattern and the second semiconductor pattern, and the first semiconductor pattern is electrically connected to the second semiconductor pattern through a via hole in the target insulating layer.

Optionally, an orthographic projection of the first semiconductor pattern onto the base is symmetric to an orthographic projection of the second semiconductor pattern onto the base.

Optionally, the target insulating layer is made of a same material as a gate insulating layer of the transistor.

Optionally, at least one of the plurality of semiconductor patterns is provided with a channel region, and an orthographic projection of the channel region onto the base is within an orthographic projection of a gate of the transistor onto the base.

Optionally, a plurality of channel regions are provided in the plurality of semiconductor patterns, and for any two of the channel regions, an orthographic projection of one channel region onto the base is outside an orthographic projection of the other channel region onto the base.

Optionally, the orthographic projection of the gate of the transistor onto the base has a strip shape, and a length of the channel region is greater than a width of the gate.

Optionally, the orthographic projection of the channel region onto the base has a zigzag shape.

Optionally, the orthographic projection of the channel region onto the base has a strip shape, and an included angle between a length direction of the channel region and a width direction of the gate is greater than zero.

Optionally, the target insulating layer is made of a same material as a gate insulating layer of the transistor; a plurality of channel regions are provided in the plurality of semiconductor patterns, and an orthographic projection of the channel region onto the base is within an orthographic projection of a gate of the transistor onto the base; for any two of the channel regions, an orthographic projection of one channel region onto the base is outside an orthographic projection of the other channel region onto the base; the orthographic projection of the gate of the transistor onto the base has a strip shape, and a length of the channel region is greater than a width of the gate; and the transistor meets any condition in a set of first conditions, and any condition in a set of second conditions, the set of first conditions includes:

the plurality of semiconductor patterns are respectively located in different layers; and the plurality of semiconductor patterns include at least two semiconductor patterns located in the same layer, and the set of second conditions includes:

the orthographic projection of the channel region onto the base has a zigzag shape;

the orthographic projection of the channel region onto the base has a curved shape; and the orthographic projection of the channel region onto the base has a strip shape, and an included angle between a length direction of the channel region and a width direction of the gate is greater than zero.

In a second aspect, the present disclosure provides a method of manufacturing a transistor, including: forming a plurality of semiconductor patterns which are stacked on a base, to obtain an active layer of the transistor, wherein the plurality of semiconductor patterns are electrically connected; and orthographic projections of any two of the semiconductor patterns onto the base are different in shape.

Optionally, the transistor includes the transistor in the first aspect.

In a third aspect, the present disclosure provides a transistor device, including the transistor in the first aspect.

In a fourth aspect, the present disclosure provides a display substrate, including: a base, and the transistor in the first aspect located on the base.

In a fifth aspect, the present disclosure provides a display apparatus, including: a base, and the transistor in the first aspect located on the base.

BRIEF DESCRIPTION OF THE DRAWINGS

FIG. 9 is a schematic structural diagram of another channel region provided by an embodiment of the present disclosure.

FIG. 10 is a schematic structural diagram of still another channel region provided by an embodiment of the present disclosure.

FIG. 11 is a flowchart of a method of manufacturing a transistor provided by an embodiment of the present disclosure.

DETAILED DESCRIPTION

For purpose of describing the principles and technical solutions in the present disclosure more clearly, the present disclosure is described in detail below with reference to the accompanying drawings.

In the related art, the active layer in the transistor has a complicated shape, and thus both the process of manufacturing the active layer and the process of manufacturing the transistor are highly difficult. A transistor is provided in the embodiments of the present disclosure, which may solve the problem that the process of manufacturing the transistor in the related art is highly difficult.

Figure 1:
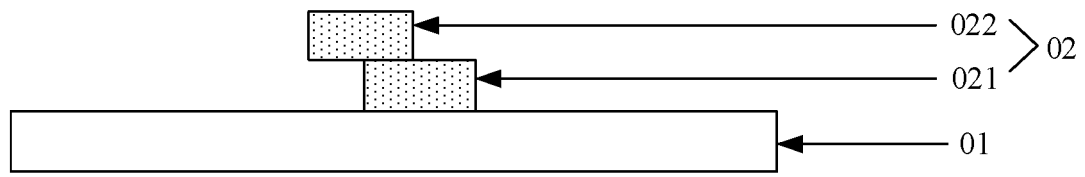
FIG. 1 is a sectional view of a transistor provided by an embodiment of the present disclosure.
Figure 2:
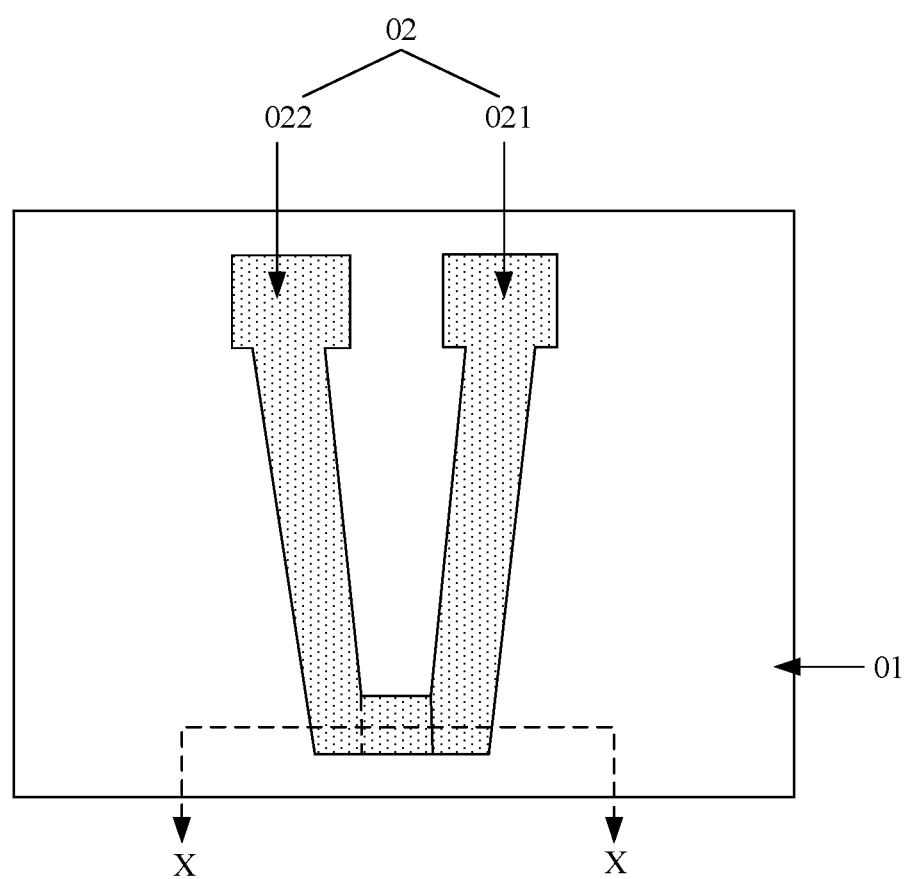
FIG. 2 is a top view of a local structure of a transistor provided by an embodiment of the present disclosure.

FIG. 1 is a sectional view of a transistor provided by an embodiment of the present disclosure. FIG. 2 is a top view of a local structure of a transistor provided by an embodiment of the present disclosure, and FIG. 1 illustrates the sectional view of the structure of FIG. 2 at X-X position. Referring to FIG. 1 and FIG. 2, the transistor is located on a base 01. The transistor includes an active layer 02. The active layer 02 includes: a plurality of semiconductor patterns which are stacked (for example, the semiconductor pattern 021 and the semiconductor pattern 022 in FIG. 1); and the plurality of semiconductor patterns are electrically connected, and orthographic projections of any two of the semiconductor patterns onto the base 01 are different in shape.

It is to be noted that the transistor including two semiconductor patterns is used as an example in the embodiment of the present disclosure. Optionally, the number of semiconductor patterns in the transistor may also be other numerical values, such as 3, 4 or 5, etc., which is not limited by the embodiment of the present disclosure. The base 01 may be a structure capable of supporting the transistor such as a substrate or an insulating layer.

Orthographic projections of the plurality of semiconductor patterns onto the base 01 may overlap, and may also not overlap. In FIG. 1, it is exemplified that the orthographic projections of the plurality of semiconductor patterns onto the base 01 overlap. However, no matter whether the orthographic projections of the plurality of semiconductor patterns 021 onto the base 01 overlap, the orthographic projections of the plurality of semiconductor patterns 021 onto the base 01 are different.

To sum up, the active layer of the transistor provided by the embodiment of the present disclosure includes a plurality of semiconductor patterns which are stacked; and when the active layer is manufactured, these semiconductor patterns can be respectively manufactured. As the semiconductor patterns are stacked and the orthographic projections of the semiconductor patterns onto the base have different shapes, each semiconductor pattern has a simple shape that is easier to manufacture than the whole active layer in the related art. Therefore, the difficulty in forming each semiconductor pattern and forming the whole active layer is lower, thereby reducing the difficulty in the manufacture of the transistor.

Meanwhile, when the structure of the active layer is complicated, in order to ensure the smooth manufacture of the active layer, respective portions of the active layer will be generally arranged to have a great distance therebetween. As a result, the transistor will have a relatively large size. In the transistor provided by the embodiment of the present disclosure, as the structure of each semiconductor pattern is simple and it is much easier to manufacture each semiconductor pattern, the plurality of semiconductor patterns can be arranged to have less distance therebetween, thereby reducing the size of the transistor where the active layer formed by the plurality of semiconductor patterns locates. Furthermore, when the transistor is used in a display panel, as the transistor has a small size, the aperture ratio of the display panel can be higher, thereby improving the display effect of the display panel.

Optionally, the plurality of semiconductor patterns in the active layer 02 can be sequentially stacked, and respectively located in different layers. As shown in FIG. 1, the semiconductor pattern 021 and the semiconductor pattern 022 in the active layer 02 may be sequentially stacked along a direction away from the base 01. Certainly, the plurality of semiconductor patterns may also not be sequentially stacked, which is not limited by this embodiment of the present disclosure. It is to be noted that the semiconductor pattern located in the same layer in the embodiment of the present disclosure may generally be obtained by treating the same semiconductor layer with a single patterning process. When two semiconductor patterns are located in different layers, it is necessary to treat a semiconductor layer by one patterning process to obtain one semiconductor pattern in the two semiconductor patterns, and treat another semiconductor layer by a second patterning process to obtain the other semiconductor pattern.

Optionally, when the plurality of semiconductor patterns do not sequentially stack, the plurality of semiconductor patterns may include m semiconductor patterns located in the same layer, m>2. The semiconductor patterns located in one layer may be formed into a semiconductor pattern layer, the number of semiconductor patterns in the semiconductor pattern layer may be greater than or equal to 1, and there may be one or more semiconductor pattern layer which has more than one semiconductor patterns.

Figure 3:
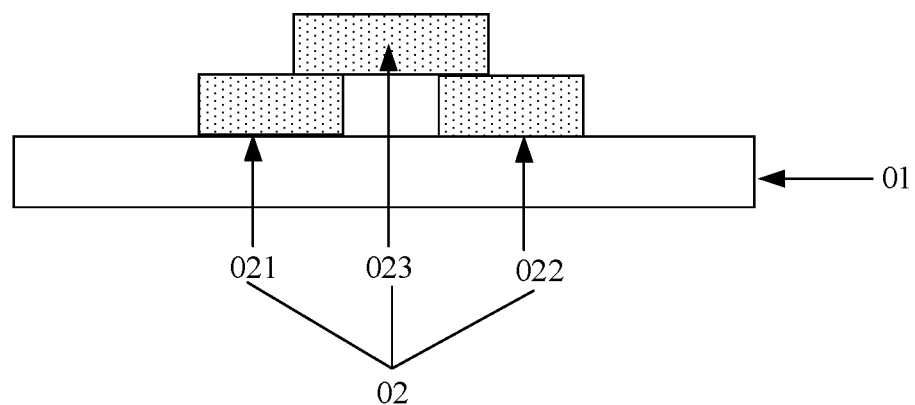
FIG. 3 is a sectional view of another transistor provided by an embodiment of the present disclosure.
Figure 4:
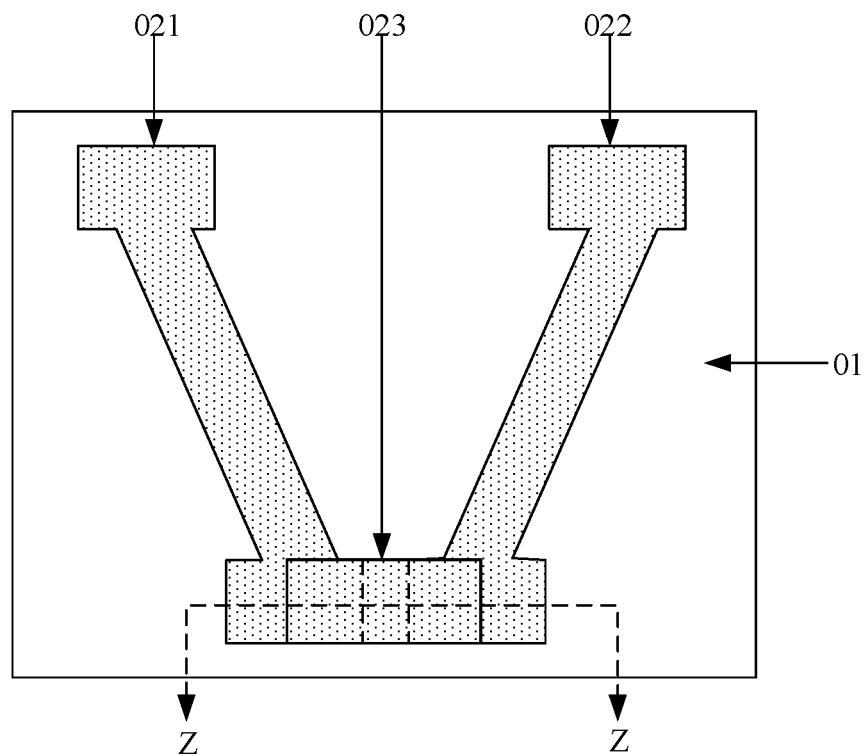
FIG. 4 is a top view of a local structure of another transistor provided by an embodiment of the present disclosure.

Exemplarily, FIG. 3 is a sectional view of another transistor provided by an embodiment of the present disclosure. FIG. 4 is a top view of a local structure of another transistor provided by an embodiment of the present disclosure, and FIG. 3 illustrates the sectional view of the structure in FIG. 4 at Z-Z position. Referring to FIG. 3 and FIG. 4, the plurality of semiconductor patterns in the active layer 02 include: a semiconductor pattern 021, a semiconductor pattern 022 and a semiconductor pattern 023. The semiconductor pattern 021 and the semiconductor pattern 022 are located in one semiconductor pattern layer, and the semiconductor pattern 023 is located in another semiconductor pattern layer. That is, in the two semiconductor pattern layers, one layer has more than one semiconductor patterns. Orthographic projections of two adjacent semiconductor pattern layers onto the base 01 overlap.

Figure 5:
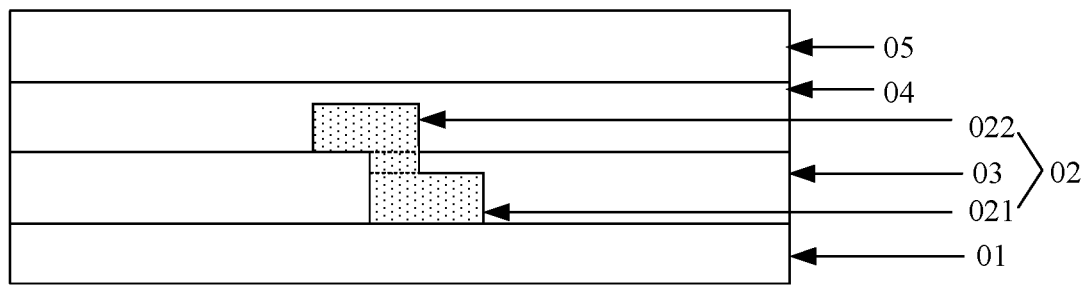
FIG. 5 is a schematic structural diagram of still another transistor provided by an embodiment of the present disclosure.
Figure 6:
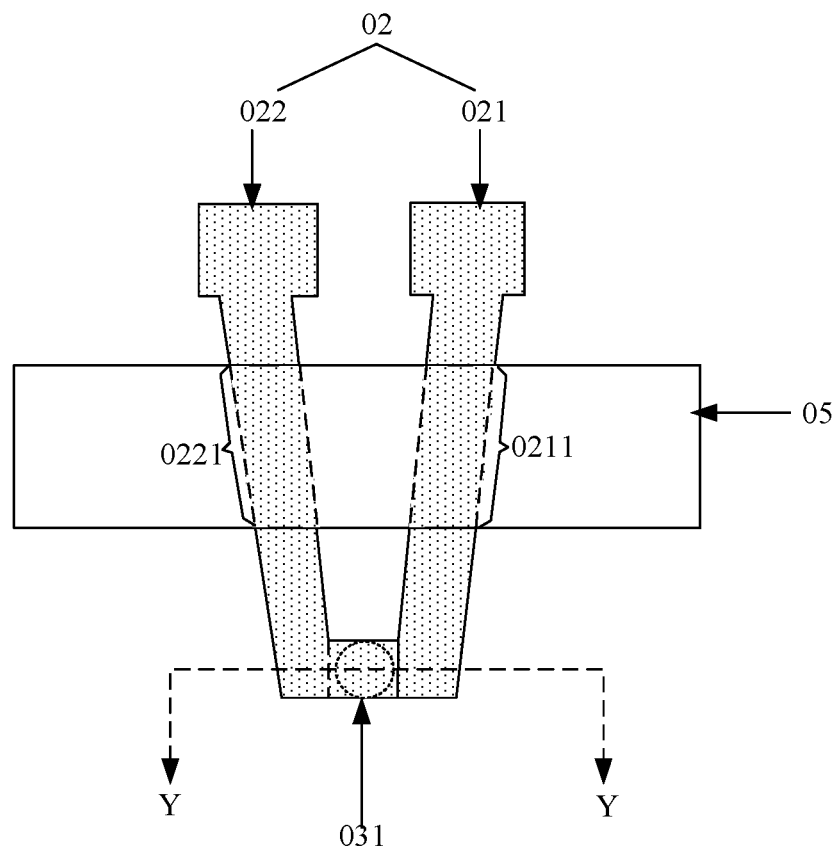
FIG. 6 is a top view of a local structure of still another transistor provided by an embodiment of the present disclosure.

Optionally, FIG. 5 is a schematic structural diagram of still another transistor provided by an embodiment of the present disclosure. FIG. 6 is a top view of a local structure of still another transistor provided by an embodiment of the present disclosure, and FIG. 5 illustrates the sectional view of the structure in FIG. 6 at Y-Y position. Referring to FIG. 5 and FIG. 6, on the basis of the transistor shown in FIG. 1 and FIG. 2, the transistor may further include: a target insulating layer 03 (not shown in FIG. 6), a gate insulating layer 04 (not shown in FIG. 6), a gate 05 and a source-drain pattern (not shown in FIG. 5 and FIG. 6).

The above plurality of semiconductor patterns include: a first semiconductor pattern (such as the above semiconductor pattern 021) and a second semiconductor pattern (such as the above semiconductor pattern 022) that are sequentially stacked. The target insulating layer 03 may be located between the first semiconductor pattern and the second semiconductor pattern, and the first semiconductor pattern is electrically connected to the second semiconductor pattern through a via hole 031 in the target insulating layer 03. Optionally, an orthographic projection of the first semiconductor pattern onto the base 01 is symmetric to an orthographic projection of the second semiconductor pattern onto the base 01.

Optionally, target insulating layer(s) may be provided between every two adjacent and stacked semiconductor patterns in the plurality of semiconductor patterns. The via hole 031 can be provided on each target insulating layer 03, and two semiconductor patterns adjacent to the target insulating layer 03 may be electrically connected through the via hole 031. The number of target insulating layers 03 increases as the number of semiconductor patterns increases, and the number of target insulating layers 03 may be one less than the number of semiconductor patterns.

Optionally, the target insulating layer 03 has a thickness ranging from 400 to 600 Å. When the thickness of the target insulating layer 03 is within the above thickness range, it can be ensured that two semiconductor patterns adjacent to the target insulating layer 03 can be effectively and electrically connected through the via hole 031 in the target insulating layer 03.

Optionally, the target insulating layer 03 may be made of silicon nitride, silicon oxide, silicon oxynitride, or the like. When the transistor 0 includes a plurality of target insulating layers 03, the different target insulating layers 03 may be made of different materials or the same material, which is not limited by the embodiment of the present disclosure. Optionally, the target insulating layer 03 and the gate insulating layer 04 may be made of the same material or different materials. In the embodiment, the target insulating layer 03 and the gate insulating layer 04 made of the same material are taking as an example, and then a same material is used to manufacture both the target insulating layer 03 and the gate insulating layer 04.

It is to be noted that, in the embodiment of the present disclosure, an active layer including the target insulating layer is taken as an example. Optionally, the active layer may also not include the target insulating layer but merely includes the plurality of stacked semiconductor patterns, which is not limited by the embodiment of the present disclosure.

Referring to FIG. 5 and FIG. 6 again, a part of or all of semiconductor patterns in the plurality of semiconductor patterns are provided with channel region(s) (e.g., the channel region 0221 and the channel region 0211 in FIG. 6), and an orthographic projection of the channel region onto the base 01 is within an orthographic projection of the gate 05 of the transistor onto the base 01. In FIG. 5, it is exemplified that all the semiconductor patterns in the active layer 02 are provided with channel regions. The orthographic projection of the channel region of each semiconductor pattern onto the base 01 is the exact portion where the orthographic projection of the semiconductor pattern onto the base 01 overlaps with the orthographic projection of the gate 05 onto the base 01. As can be seen, the channel region in the semiconductor pattern is also a region where the semiconductor pattern overlaps the gate 05. By applying different electrical signals to the gate 05, the channel region in the active layer 02 can be controlled to be turned on or off.

Further referring to FIG. 5 and FIG. 6, when the active layer 02 is provided with a plurality of channel regions, in any two of the channel regions, an orthographic projection of one channel region onto the base 01 is outside an orthographic projection of the other channel region onto the base 01. For example, for the channel region 0211 and the channel region 0221, the orthographic projection of the channel region 0211 onto the base 01 is outside the orthographic projection of the channel region 0221 onto the base 01. As can be seen, the orthographic projections of the plurality of channel regions onto the base 01 are independent from one another.

Optionally, the orthographic projection of the gate 05 onto the base 01 of the active layer 02 may have a strip shape. A length of the channel region in the active layer 02 is greater than a width of the gate 05. It is to be noted that the length of the channel region is: when the channel region is in a switch-on state, the path length that the carrier (such as the electron or the hole) needs to travel upon passing through the channel region.

In the related art, the length of the channel region is equal to the width of the gate. In this case, the channel region is relatively short, and the carrier can pass through the channel region easily. As a consequence, when the channel region is in a switch-off state, some carriers still remain transmitted in the channel region and current (the current is referred to as a leakage current) still exists in the channel region and the transistor cannot be turned off. When the transistor is applied to a display apparatus, the display effect of the display apparatus is relatively poor. However, in the embodiment of the present disclosure, the length of the channel region is greater than the width of the gate. At this time, the channel region is relatively long and the carrier is more difficult to pass through the channel region. When the channel region is in a switch-off state, the number of carriers transmitted in the channel region can be decreased, the leakage current in the channel region can be reduced, and the transistor can be turned off effectively. When the transistor is applied to a display apparatus, the display effect of the display apparatus can be improved.

Optionally, when the length of the channel region is shorter than the width of the gate, the orthographic projection of the channel region onto the base 01 may have a strip, zigzag or curved shape.

Figure 7:
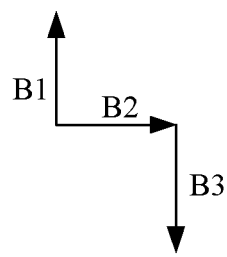
FIG. 7 is a schematic structural diagram of a channel region provided by an embodiment of the present disclosure.
Figure 7:
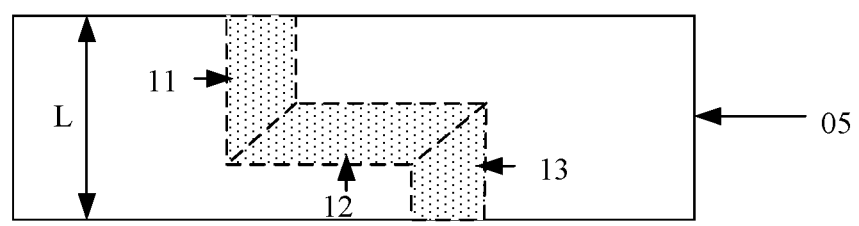

Exemplarily, FIG. 7 is a schematic structural diagram of a channel region provided by an embodiment of the present disclosure. As shown in FIG. 7, when the orthographic projection of the channel region (not shown in the figure) onto the base 01 has a zigzag shape, the channel region may include: a first channel strip 11, a second channel strip 12 and a third channel strip 13 that are sequentially connected. The length direction B1 of the first channel strip 11 is parallel to the length direction B3 of the third channel strip 13, and the length direction B1 of the first channel strip 11 is perpendicular to the length direction B2 of the channel strip 0212.

Figure 8:
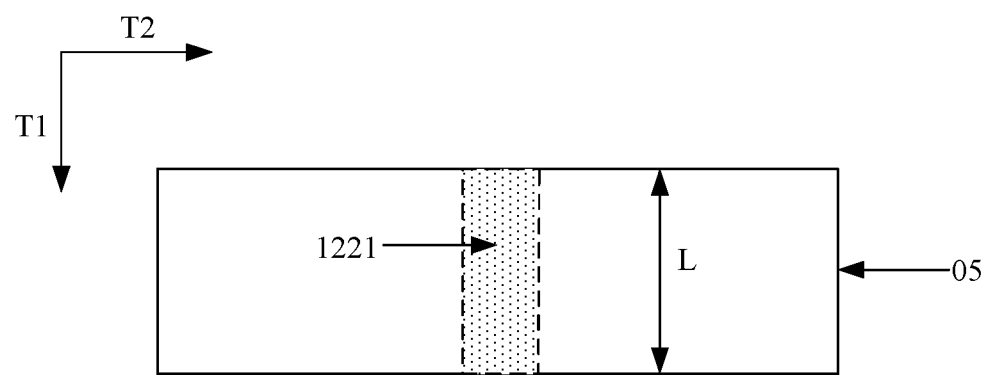
FIG. 8 is a schematic structural diagram of a channel region provided by the related art.

In FIG. 7, the length of the channel region is equal to a sum of the length L1 of the first channel strip 11, the length L2 of the second channel strip 12 and the length L3 of the third channel strip 13 (i.e., L1+L2+L3). L1+L3 is equal to the width L of the gate 05, such that the length of the channel region is greater than the width L of the gate 05. In the related art, as shown in FIG. 8, the channel region 1221 has a strip shape, and the length direction T1 thereof is perpendicular to the width direction T2 of the gate 05, therefore, the length of the channel region 1221 is equal to the width L of the gate 05. It is apparent that the length of the channel region in the embodiment of the present disclosure is greater than that of the channel region in the related art.

Exemplarily, FIG. 9 is a schematic structural diagram of another channel region provided by an embodiment of the present disclosure. As shown in FIG. 9, when the orthographic projection of the channel region 0221 onto the base 01 is in a strip shape, an included angle α between a length direction C1 of the channel region 0221 and a width direction C2 of the gate 05 may be greater than 0° (α being 45° is used as an example in FIG. 9). In this case, as the length of the channel region 0221 is equal to the quotient of the width L of the gate 05 and the cosine of the included angle α, and the cosine of the included angle α is greater than 1, the length of the channel region 0221 is greater than the width L of the gate 05. Exemplarily, when α=45° (degrees), the length of the channel region 0221 is equal to (cos 45°)$^{-1}$*L=2L>L. Since the length of the channel region is equal to the width of the gate in the related art, the length of the channel region 0221 in the embodiment of the present disclosure is greater than that of the channel region in the related art.

When the orthographic projection of the channel region 0221 onto the base 01 has a curved shape, the structure may be as shown in FIG. 10. As can be obviously seen from FIG. 10, the length of the channel region 0221 is greater than the width L of the gate 05.

The gate 05 having a strip shape is used as an example in the embodiment of the present disclosure. Optionally, the gate 05 may not be in a strip shape, for example, the gate 05 may be in a square shape, a circular shape or an irregular shape, etc. At this time, the length of the channel region may be greater than the length of the gate 05 in a target direction. The target direction is a direction which any end of the orthographic projection of any semiconductor pattern in the active layer onto the base has the shortest distance from the orthographic projection of the gate onto the base.

It is to be noted that FIG. 6 takes the transistor including a plurality of channel regions (such as two channel regions), and the plurality of channel regions being the channel region 0221 shown in FIG. 9 as an example. Optionally, the plurality of channel regions may also be different in shape, or may also not be other types of channel region than the channel region 0221 shown in FIG. 9. The transistor 0 may include one channel region, or more than one channel regions, which is not limited by the embodiment of the present disclosure. When the transistor includes one channel region, the transistor may be referred to as a single-gate transistor; and when the transistor includes a plurality of channel regions, the transistor may be referred to as a multi-gate transistor (such as a double-gate transistor including two channel regions).

Additionally, the transistor provided by the embodiment of the present disclosure may be a top-gate transistor, and may otherwise be a bottom-gate transistor. When the transistor is a top-gate transistor (as shown in FIG. 5), the gate 05 is located on a side of the active layer away from the base 01; and when the transistor is a bottom-gate transistor, the gate 05 is located between the active layer and the base 01. The source-drain pattern in the transistor may be located in the same layer with the gate, or located in a different layer from the gate. The source-drain pattern may include a source and a drain, and both the source and the drain may be electrically connected to the active layer.

To sum up, the active layer of the transistor provided by the embodiment of the present disclosure includes a plurality of semiconductor patterns which are stacked; and when the active layer is manufactured, these semiconductor patterns can be respectively manufactured. As each semiconductor pattern in the plurality of semiconductor patterns has a relatively simple shape, the difficulty in forming each semiconductor pattern and the difficulty in forming the whole active layer are both relatively low.

FIG. 11 is a flowchart of a method of manufacturing a transistor provided by an embodiment of the present disclosure, which is used to manufacture any transistor provided by the embodiments of the present disclosure. As illustrated in FIG. 11, the manufacturing method may include the following steps.

In step 1101, a plurality of semiconductor patterns which are stacked are formed on a base to obtain an active layer in the transistor, the plurality of semiconductor patterns being electrically connected, and orthographic projections of any two of the semiconductor patterns onto the base being different in shape.

To sum up, in the transistor manufactured by the method provided by the embodiment of the present disclosure, the active layer includes a plurality of semiconductor patterns which are stacked; and when the active layer is manufactured, these semiconductor patterns can be respectively manufactured. As the semiconductor patterns are stacked and the orthographic projections of the semiconductor patterns onto the base have different shapes, each semiconductor pattern has a simple shape that is easier to manufacture than the whole active layer in the related art. Therefore, the difficulty in forming each semiconductor pattern and forming the whole active layer is lower, thereby reducing the difficulty in the manufacture of the transistor.

Figure 12:
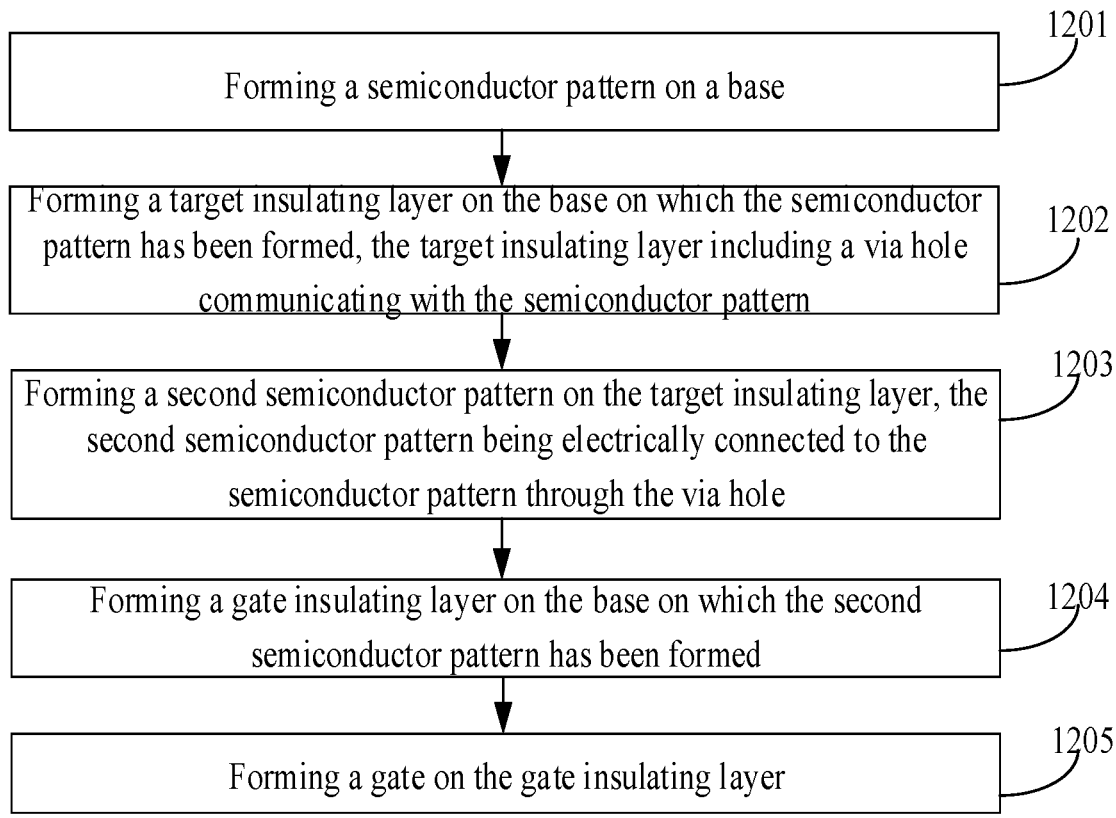
FIG. 12 is a flowchart of another method of manufacturing a transistor provided by an embodiment of the present disclosure.

FIG. 12 is a flowchart of another method of manufacturing a transistor provided by an embodiment of the present disclosure. The method illustrated in FIG. 12 is exemplified by the manufacture of a top-gate transistor, wherein the active layer of the transistor includes two semiconductor patterns that are sequentially arranged along a direction away from the base 01. As illustrated in FIG. 12, the manufacturing method may include the following steps.

In step 1201, a semiconductor pattern is formed on a base.

In the embodiment of the present disclosure, an active layer being formed on a base is used as an example.

Figure 13:
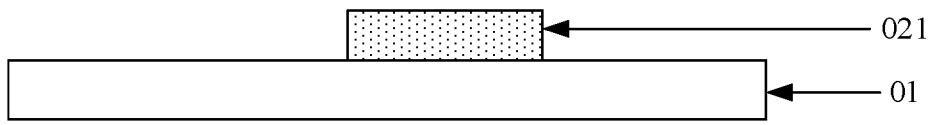
FIG. 13 is a schematic diagram showing a process of manufacturing a transistor provided by an embodiment of the present disclosure.

As shown in FIG. 13, when the active layer is manufactured, a semiconductor material layer is formed on the base 01 first; and then, one patterning process is used to treat the semiconductor material layer to obtain the semiconductor pattern 021 shown in FIG. 13.

In step 1202, a target insulating layer is formed on the base on which the semiconductor pattern has been formed, the target insulating layer including a via hole communicating with the semiconductor pattern.

Figure 14:
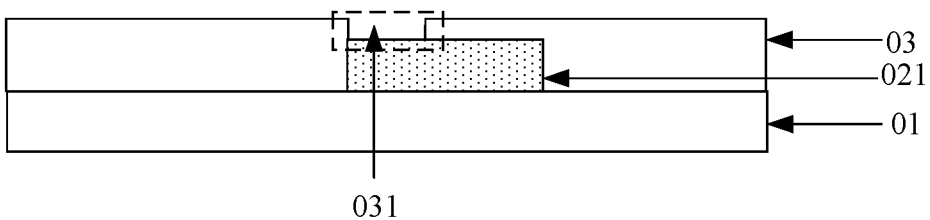
FIG. 14 is a schematic diagram showing another process of manufacturing a transistor provided by an embodiment of the present disclosure.

After the formation of the semiconductor pattern, the target insulating layer 03 shown in FIG. 14 may be formed on the base on which the semiconductor pattern has been formed, and the target insulating layer 03 is provided with the via hole 031; and partial region of the semiconductor pattern 021 will be exposed through the via hole 031.

In step 1203, a second semiconductor pattern is formed on the target insulating layer, the second semiconductor pattern being electrically connected to the semiconductor pattern through a via hole.

Figure 15:
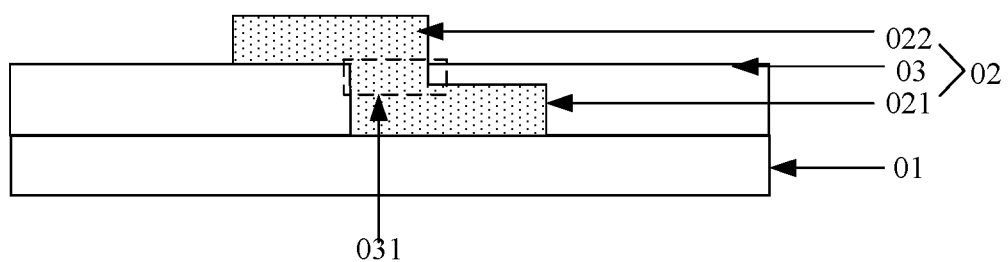
FIG. 15 is a schematic diagram showing still another process of manufacturing a transistor provided by an embodiment of the present disclosure.

After the formation of the target insulating layer, a second semiconductor pattern 022 shown in FIG. 15 may be formed on the target insulating layer; and the second semiconductor pattern 022 may be electrically connected to the semiconductor pattern 021 through a via hole 031 in the target insulating layer 03. It is to be noted that the method for forming the second semiconductor pattern 022 is similar to the method for forming the semiconductor pattern 021 in step 1201, which is not elaborated herein in the embodiment of the present disclosure.

In step 1204, a gate insulating layer is formed on the base on which the second semiconductor pattern has been formed.

Figure 16:
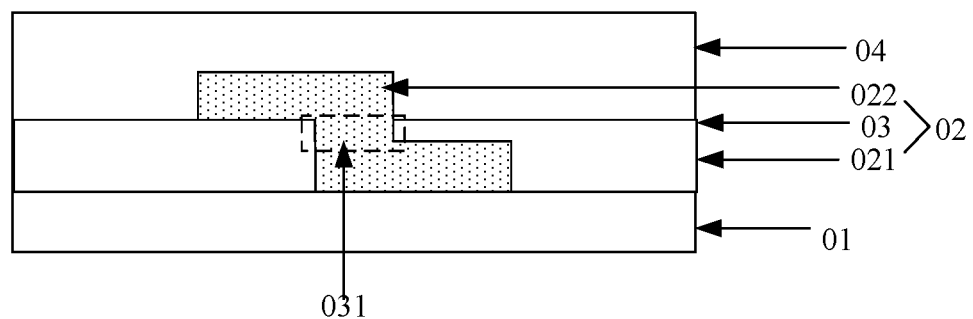
FIG. 16 is a schematic diagram showing yet still another process of manufacturing a transistor provided by an embodiment of the present disclosure.

After the formation of the second semiconductor pattern, the gate insulating layer 04 shown in FIG. 16 may be formed on the base on which the second semiconductor pattern has been formed.

In step 1205, a gate is formed on the gate insulating layer.

After the formation of the gate insulating layer, the gate 05 shown in FIG. 5 may be formed on the gate insulating layer.

Optionally, the transistor may further include a source-drain pattern, and the source-drain pattern may be located in the same layer with the gate. During the formation of the gate, the source-drain pattern can be formed simultaneously. Optionally, the source-drain pattern may also be located in a different layer from the gate; and in this case, it is necessary to form the gate and the source-drain pattern respectively.

To sum up, in the transistor manufactured by the method provided by the embodiment of the present disclosure, the active layer includes a plurality of semiconductor patterns which are stacked; and when the active layer is manufactured, these semiconductor patterns can be respectively manufactured. As the semiconductor patterns are stacked and the orthographic projections of the semiconductor patterns onto the base have different shapes, each semiconductor pattern has a simple shape that is easier to manufacture than the whole active layer in the related art. Therefore, the difficulty in forming each semiconductor pattern and forming the whole active layer is lower, thereby reducing the difficulty in the manufacture of the transistor.

An embodiment of the present disclosure provides a transistor device, including the transistor provided by the above embodiment of the present disclosure (such as the transistor having the active layer shown in FIG. 1 to FIG. 6).

An embodiment of the present disclosure provides a display substrate including a base and a transistor located on the base, the transistor being that provided by the embodiment of the present disclosure (such as the transistor having the active layer shown in FIG. 1 to FIG. 6).

An embodiment of the present disclosure provides a display apparatus including a base and a transistor located on the base, the transistor being that provided by the embodiment of the present disclosure (such as the transistor having the active layer shown in FIG. 1 to FIG. 6).

Exemplarily, the display apparatus may be any products or parts with a display function, such as a liquid crystal panel, an organic light-emitting diode (OLED) panel, a Light-Emitting Diode (LED) panel, a quantum dot panel, electronic paper, a mobile phone, a tablet computer, a television, a display, a notebook computer, a digital photo frame, a navigator, etc.

It is to be noted that the sizes of the layers and regions may be exaggerated for purpose of clear illustration of the accompanying drawings. It may be understood that when an element or a layer is referred to as being "on" another element or layer, it may be directly on the other element or an intervening layer may be present therebetween. Besides, it may be understood that when an element or a layer is referred to as being "under" another element or layer, it may be directly under the other element, or more than one intervening layer or element may be present therebetween. Additionally, it may further be understood that when an element or a layer is referred to as being "between" two layers or two elements, it may be the only layer between the two layers or two elements, or more than one intervening layer or element may also be present therebetween. The like reference sign refers to the like element throughout the specification.

In present disclosure, the terms like "first", "second", "third" and the like are merely for a descriptive purpose but cannot be understood as indicating or implying a relative importance. The term "a plurality of" means two or more than two, unless otherwise specifically defined.

It is to be noted that mutual reference can be made between the method embodiments according to the embodiments of the present disclosure and the embodiments of the corresponding transistor, which is not limited in the embodiments of the present disclosure. The sequence of the steps of the method embodiment provided by the embodiments of the present disclosure may be properly adjusted, the steps may also be added or omitted correspondingly depending on the practical requirements, and any method readily conceivable for those skilled in the art within the technical scope disclosed by the present disclosure should be included in the protection scope of the present disclosure and thus is not elaborated here.

The descriptions above are only optional embodiments of the present disclosure rather than limitations on the present disclosure; and any modifications, equivalents, improvements and the like made within the spirits and principles of the present disclosure should be encompassed by the protection scope of the present disclosure.

The invention claimed is:

1. A transistor, the transistor being located on a base and having an active layer, and the active layer of the transistor comprising a plurality of semiconductor patterns which are stacked, wherein
the plurality of semiconductor patterns are electrically connected; and orthographic projections of any two of the semiconductor patterns on the base are different in shape;
the plurality of semiconductor patterns comprise: a first semiconductor pattern and a second semiconductor pattern that are stacked, and the transistor further comprises: a target insulating layer; and
the target insulating layer is located between the first semiconductor pattern and the second semiconductor pattern, and the first semiconductor pattern is electrically connected to the second semiconductor pattern through a via hole in the target insulating layer;
an orthographic projection of the first semiconductor pattern onto the base is symmetric to an orthographic projection of the second semiconductor pattern onto the base.

2. The transistor according to claim 1, wherein the plurality of semiconductor patterns are respectively located in different layers.

3. The transistor according to claim 1, wherein the plurality of semiconductor patterns comprise at least two semiconductor patterns located in a same layer.

4. The transistor according to claim 1, wherein the target insulating layer is made of a same material as a gate insulating layer of the transistor.

5. The transistor according to claim 1, wherein at least one of the plurality of semiconductor patterns is provided with a channel region, and an orthographic projection of the channel region onto the base is within an orthographic projection of a gate of the transistor onto the base.

6. The transistor according to claim 5, wherein a plurality of channel regions are provided in the plurality of semiconductor patterns, and for any two of the channel regions, an orthographic projection of one channel region onto the base is outside an orthographic projection of the other channel region onto the base.

7. The transistor according to claim 5, wherein the orthographic projection of the gate of the transistor onto the base has a strip shape, and a length of the channel region is greater than a width of the gate.

8. The transistor according to claim 7, wherein the orthographic projection of the channel region onto the base has a zigzag shape.

9. The transistor according to claim 7, wherein the orthographic projection of the channel region onto the base has a strip shape, and an included angle between a length direction of the channel region and a width direction of the gate is greater than zero.

10. The transistor according to claim 1, wherein the target insulating layer is made of a same material as a gate insulating layer of the transistor; a plurality of channel regions are provided in the plurality of semiconductor patterns, and an orthographic projection of a channel region onto the base is within an orthographic projection of a gate of the transistor onto the base; for any two of the channel regions, an orthographic projection of one channel region onto the base is outside an orthographic projection of the other channel region onto the base; the orthographic projection of the gate of the transistor onto the base has a strip shape, and a length of the channel region is greater than a width of the gate; and the transistor meets any condition in a set of first conditions, and any condition in a set of second conditions,
the set of first conditions comprises:
the plurality of semiconductor patterns are respectively located in different layers; and
the plurality of semiconductor patterns comprise at least two semiconductor patterns located in the same layer, and
the set of second conditions comprises:
the orthographic projection of the channel region onto the base has a zigzag shape;
the orthographic projection of the channel region onto the base has a curved shape; and
the orthographic projection of the channel region onto the base has a strip shape, and an included angle between a length direction of the channel region and a width direction of the gate is greater than zero.

11. A transistor device, comprising: a base, and the transistor according to claim 1 which is located on the base.

12. The transistor device according to claim 11, wherein the target insulating layer is made of a same material as a gate insulating layer of the transistor; a plurality of channel regions are provided in the plurality of semiconductor patterns and an orthographic projection of a channel region onto the base is within an orthographic projection of a gate of the transistor onto the base; for any two of the channel regions, an orthographic projection of one channel region onto the base is outside an orthographic projection of the other channel region onto the base; the orthographic projection of the gate of the transistor onto the base has a strip shape, and a length of the channel region is greater than a width of the gate; and the transistor meets any condition in a set of first conditions, and any condition in a set of second conditions,
the set of first conditions comprises:
the plurality of semiconductor patterns are respectively located in different layers; and
the plurality of semiconductor patterns comprise at least two semiconductor patterns located in the same layer, and
the set of second conditions comprises:
the orthographic projection of the channel region onto the base has a zigzag shape;
the orthographic projection of the channel region onto the base has a curved shape; and
the orthographic projection of the channel region onto the base has a strip shape, and an included angle between a length direction of the channel region and a width direction of the gate is greater than zero.

13. A display substrate, comprising: a base, and the transistor according to claim 1 which is located on the base.

14. The display substrate according to claim 13, wherein the target insulating layer is made of a same material as a gate insulating layer of the transistor; a plurality of channel regions are provided in the plurality of semiconductor patterns, and an orthographic projection of a channel region onto the base is within an orthographic projection of a gate of the transistor onto the base; for any two of the channel regions, an orthographic projection of one channel region onto the base is outside an orthographic projection of the other channel region onto the base; the orthographic projection of the gate of the transistor onto the base has a strip shape, and a length of the channel region is greater than a width of the gate; and the transistor meets any condition in a set of first conditions, and any condition in a set of second conditions, the set of first conditions comprises:
the plurality of semiconductor patterns are respectively located in different layers; and
the plurality of semiconductor patterns comprise at least two semiconductor patterns located in the same layer, and the set of second conditions comprises:
the orthographic projection of the channel region onto the base has a zigzag shape;
the orthographic projection of the channel region onto the base has a curved shape; and
the orthographic projection of the channel region onto the base has a strip shape, and an included angle between a length direction of the channel region and a width direction of the gate is greater than zero.

15. A display apparatus, comprising: a base, and the transistor according to claim 1 which is bested on the base.

16. The display apparatus according to claim 15, wherein the target insulating layer is made of a same material as a gate insulating layer of the transistor; a plurality of channel regions are provided in the plurality of semiconductor patterns, and an orthographic projection of a channel region onto the base is within an orthographic projection of a gate of the transistor onto the base; for any two of the channel regions, an orthographic projection of one channel region onto the base is outside an orthographic projection of the other channel region onto the base; the orthographic projection of the gate of the transistor onto the base has a strip shape, and a length of the channel region is greater than a width of the gate; and the transistor meets any condition in a set of first conditions, and any condition in a set of second conditions, the set of first conditions comprises:
the plurality of semiconductor patterns are respectively located in different layers; and
the plurality of semiconductor patterns comprise at least two semiconductor patterns located in the same layer; and the set of second conditions comprises:
the orthographic projection of the channel region onto the base has a zigzag shape;
the orthographic projection of the channel region onto the base has a curved shape; and
the orthographic projection of the channel region onto the base has a strip shape, and an included angle between a length direction of the channel region and a width direction of the gate is greater than zero.

17. A method of manufacturing a transistor, comprising:
forming a plurality of semiconductor patterns which are stacked on a base, to obtain an active layer of the transistor,
wherein the plurality of semiconductor patterns are electrically connected; and orthographic projections of any two of the semiconductor patterns onto the base are different in shape;
the plurality of semiconductor patterns comprise: a first semiconductor pattern and a second semiconductor pattern that are stacked, and the transistor further comprises: a target insulating layer; and
the target insulating layer is located between the first semiconductor pattern and the second semiconductor pattern, and the first semiconductor pattern is electrically connected to the second semiconductor pattern through a via hole in the target insulating layer;
an orthographic projection of the first semiconductor pattern onto the base is symmetric to an orthographic projection of the second semiconductor pattern onto the base.

18. The method according to claim 17, wherein the target insulating layer is made of a same material as a gate insulating layer of the transistor; a plurality of channel regions are provided in the plurality of semiconductor patterns, and an orthographic projection of a channel region onto the base is within an orthographic projection of a gate of the transistor onto the base; for any two of the channel regions, an orthographic projection of one channel region onto the base is outside an orthographic projection of the other channel region onto the base; the orthographic projection of the gate of the transistor onto the base has a strip shape, and a length of the channel region is greater than a width of the gate; and the transistor meets any condition in a set of first conditions, and any condition in a set of second conditions, the set of first conditions comprises:
the plurality of semiconductor patterns are respectively located in different layers; and
the plurality of semiconductor patterns comprise at least two semiconductor patterns located in the same layer, and the set of second conditions comprises:
the orthographic projection of the channel region onto the base has a zigzag shape;
the orthographic projection of the channel region onto the base has a curved shape; and
the orthographic projection of the channel region onto the base has a strip shape, and an included angle between a length direction of the channel region and a width direction of the gate is greater than zero.

* * * * *